(12) United States Patent  
Sato

(10) Patent No.: US 8,746,259 B2  
(45) Date of Patent: Jun. 10, 2014

(54) SUBSTRATE PROCESSING APPARATUS, SUBSTRATE PROCESSING METHOD AND COMPUTER-READABLE MEDIUM STORING PROGRAM

(75) Inventor: Hideaki Sato, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 12/795,071

(22) Filed: Jun. 7, 2010

(65) Prior Publication Data

US 2010/0307533 A1  Dec. 9, 2010

(30) Foreign Application Priority Data

Jun. 9, 2009 (JP) ................................ 2009-137892

(51) Int. Cl.  
*B08B 3/00* (2006.01)

(52) U.S. Cl.  
USPC ........................................ 134/94.1; 134/95.1

(58) Field of Classification Search  
USPC .......... 134/10, 26, 28, 56 R, 94.1, 95.1, 96.1, 134/98.1, 99.1, 103.1, 104.2, 184, 186  
See application file for complete search history.

(56) References Cited

U.S. PATENT DOCUMENTS

| | | | |
|---|---|---|---|
| 5,575,079 A * | 11/1996 | Yokomizo et al. | 34/78 |
| 6,415,803 B1 * | 7/2002 | Sundin et al. | 134/113 |
| 6,823,876 B1 * | 11/2004 | Chang et al. | 134/22.1 |
| 2001/0023700 A1 * | 9/2001 | Drayer et al. | 134/1.3 |

FOREIGN PATENT DOCUMENTS

| | | | | |
|---|---|---|---|---|
| JP | 11-330034 A | 11/1999 | | |
| JP | 2000058492 A * | 2/2000 | ............ | H01L 21/304 |
| JP | 2005-166847 A | 6/2005 | | |

OTHER PUBLICATIONS

JP 2000-058492 Machine Translation Feb. 2000 Japan Muraoka et al.*

* cited by examiner

*Primary Examiner* — Jason Ko  
(74) *Attorney, Agent, or Firm* — Abelman, Frayne & Schwab

(57) ABSTRACT

Disclosed is a substrate processing apparatus, a substrate processing method and a computer-readable medium capable of recovering an extended amount of discharged solution from a processing unit thereby reducing the amount of deionized water for the processing and the cost. The substrate processing apparatus includes, inter alia, a first and second discharge solution lines each connected to a downstream side of a discharge unit, and the discharged solution from each of the first and second discharge solution lines is independently delivered to the processing solution supply unit as a recovered solution. Also, the substrate processing apparatus includes a converting unit that converts flow of the discharged solution from the discharge unit either to the first discharge solution line or to the second discharge solution line. The processing solution supply unit selectively delivers the recovered solution from the first and second discharge solution lines to the processing unit.

12 Claims, 4 Drawing Sheets

SUBSTRATE PROCESSING APPARATUS, SUBSTRATE PROCESSING METHOD AND COMPUTER-READABLE MEDIUM STORING PROGRAM

This application is based on and claims priority from Japanese Patent Application No. 2009-137892, filed on Jun. 9, 2009, with the Japanese Patent Office, the disclosure of which is incorporated herein in its entirety by reference.

TECHNICAL FIELD

The present disclosure relates to a substrate processing apparatus that performs a rinsing process for the substrate after the substrate is processed by a chemical solution. The present disclosure also relates to a substrate processing method based on the substrate processing apparatus and a computer-readable medium to perform the substrate processing method. Particularly, the substrate processing apparatus of the present disclosure is configured to recover and reuse an increased amount of a discharged solution from a processing unit, thereby reducing the use of deionized water and cutting manufacturing costs.

BACKGROUND

Conventionally, various types of substrate processing apparatuses have been known that perform a rinsing process for a substrate such as a semiconductor wafer (hereinafter a wafer) after the wafer is processed by the chemical solution. See, for example, Japanese Patent No. 3336952.

Generally, a substrate processing apparatus stores the chemical solution into a processing bath and immerses a plurality of wafers (for example, 50 wafers) into the chemical solution, thereby performing a chemical process for the wafers. Subsequently, the chemical solution in the processing bath is replaced with deionized water and the wafers are immersed into deionized water thereby performing a rinsing process of the wafers.

The substrate processing apparatus as disclosed in Japanese Patent No. 3336952 is equipped with a densitometer that detects a concentration of, for example, TOC (a total organic carbon) of a discharged solution discharged from the processing bath to a discharge line connected to the processing bath. The densitometer is configured to detect the concentration of the discharged solution discharged from the processing bath when the wafers are rinsed in a rinsing process. Generally, when the wafers are rinsed, the discharged solution from the processing bath is becoming cleaner gradually and the concentration of the discharged solution is becoming lower gradually. In particular, in the substrate processing apparatus as disclosed in Japanese Patent No. 3336952, the discharged solution is recovered and reused when the concentration of the discharged solution detected by the densitometer is lower than a predetermined concentration.

However, there is problem in the conventional substrate processing apparatus as disclosed in Japanese Patent No. 3336952 in that it is hard to recover an enough amount of discharged solution and, as a result, the efficiency of the apparatus is not satisfactory. Specifically, in the conventional substrate processing apparatus, the recovered solution tends to be relatively clean similar to deionized water. Thus, an amount of the discharged solution that can be recovered is relatively small because the concentration of the discharged solution from the processing bath does not become lower than a predetermined concentration unless a sufficient time is elapsed since the wafer rinsing process begins. Therefore, an amount of deionized water necessary for the chemical solution process or rinsing process of the wafers is increased and an overall operating cost such as a driving cost for refining deionized water is increased.

SUMMARY

According to an embodiment, there is provided a substrate processing apparatus including a processing unit that processes a substrate, a processing solution supply unit that supplies a processing solution to the processing unit, a first chemical solution supply unit that supplies a first chemical solution to the processing unit, a second chemical solution supply unit that supplies a second chemical solution to the processing unit, a discharge unit that discharges a solution from the processing unit, a first discharge solution line and a second discharge solution line each connected to a downstream side of the discharge unit, and a converting unit disposed at a junction between the discharge unit and the two discharge solution lines configured to convert a flow of the discharged solution from the discharge unit either to the first discharge solution line or to the second discharge solution line. In particular, the discharged solution from the discharge unit is selectively delivered to each of the first and second discharge solution lines, and the discharge solution from each of the first and second discharge solution lines is independently delivered to the processing solution supply unit as a recovered solution, and the processing solution supply unit is configured to selectively deliver the recovered solution received from the first and second discharge solution lines to the processing unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
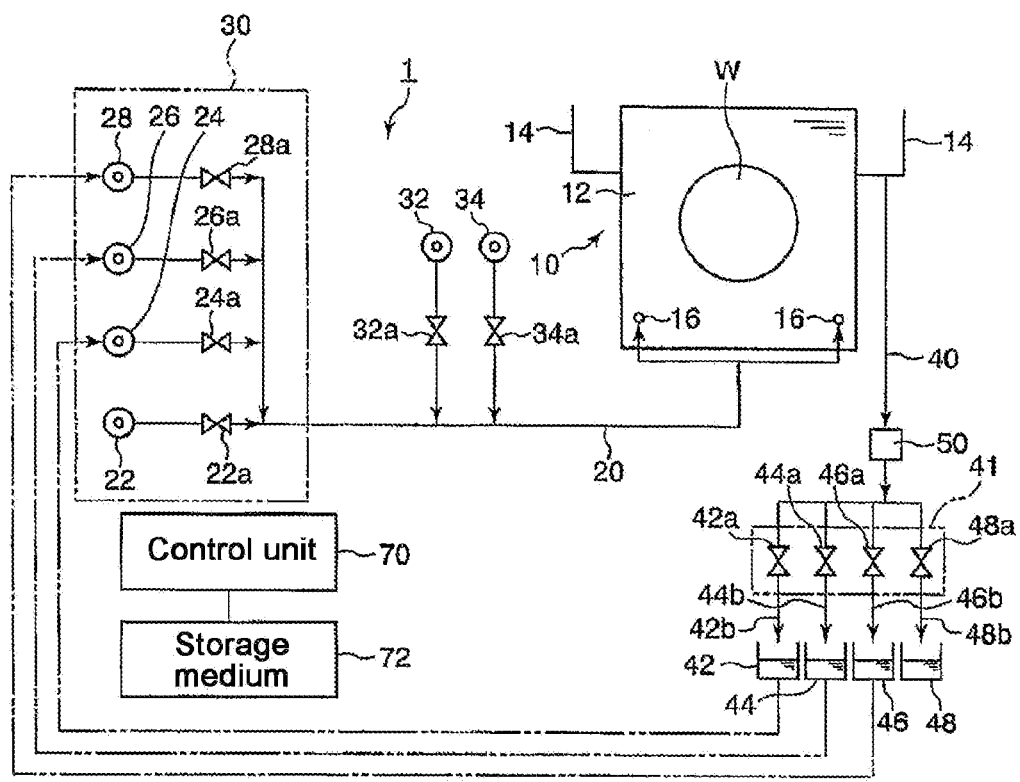
FIG. 1 is a schematic diagram of a substrate processing apparatus of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

One of the goals of the present disclosure is to provide a substrate processing apparatus configured to recover and reuse a solution discharged from a processing unit in a rinsing process of a substrate performed after a chemical solution process. In particular, the substrate processing apparatus of the present disclosure recovers and reuses the discharged solution individually according to a type of the chemical solution used in the chemical solution process of the substrate. The present disclosure also provides a substrate processing method based on the substrate processing apparatus and a computer-readable medium to store a program performing the substrate processing method. Specifically, the substrate processing apparatus of the present disclosure is capable of recovering a relatively large amount of discharged solution and thereby reducing the amount of deionized water DIW necessary for the rinsing process and the cost of manufacturing.

According to an embodiment, the substrate processing apparatus of the present disclosure includes a processing unit that processes a substrate, a processing solution supply unit that supplies a processing solution to the processing unit, a first chemical solution supply unit that supplies a first chemical solution to the processing unit, a second chemical solution supply unit that supplies a second chemical solution to the processing unit, a discharge unit that discharges a solution from the processing unit, a first discharge solution line and a second discharge solution line each connected to a downstream side of the discharge unit, and a converting unit disposed at a junction between the discharge unit and the two discharge solution lines configured to convert flow of the discharged solution from the discharge unit either to the first discharge solution line or to the second discharge solution line. In particular, the discharged solution from the discharge unit is selectively delivered to each of the first and second discharge solution lines, and the discharged solution from each of the first and second discharge solution lines is independently delivered to the processing solution supply unit as a recovered solution, and the processing solution supply unit is configured to selectively deliver the recovered solution received from the first and second discharge solution lines to the processing unit.

The processing solution supply unit of the substrate processing apparatus of the present disclosure includes a first valve that converts the flow of the recovered solution supplied from the first discharge solution line to the processing unit, and a second valve that converts the flow the recovered solution supplied from the second discharge solution line to the processing unit.

The processing solution supply unit may supply the recovered solution supplied from the first discharge solution line to the processing unit when the substrate is processed with the first chemical solution supplied from the first chemical solution supply unit to the processing unit, and the processing solution supply unit may supply the recovered solution supplied from the second discharge solution line to the processing unit when the substrate is processed with the second chemical solution supplied from the second chemical solution supply unit to the processing unit.

When a rinsing process is performed for the substrate after the substrate is processed by the first chemical solution, the converting unit may convert the flow of the discharged solution so that the discharged solution flows from the discharge unit to the first discharge solution line, and the processing solution supply unit may supply the recovered solution supplied from the first discharge solution line to the processing unit. And when a rinsing process is performed for the substrate after the substrate is processed by the second chemical solution, the converting unit may convert the flow of the discharged solution so that the discharged solution flows from the discharge unit to the second discharge solution line, and the processing solution supply unit may supply the recovered solution supplied from the second discharge solution line to the processing unit.

Specifically, the processing solution supply unit may supply deionized water DIW in addition to the recovered solution supplied from the first and the second discharge solution lines to the processing unit.

Also, the processing solution supply unit includes a converting valve configured to convert the supply of deionized water DIW to the processing unit.

Also, when a rinsing process is performed for the substrate after the substrate is processed by the first chemical solution, the processing solution supply unit may supply deionized water DIW to the processing unit after supplying the recovered solution supplied from the first discharge solution line to the processing unit. And, when a rinsing process is performed for the substrate after the substrate is processed by the second chemical solution, the processing solution supply unit may supply deionized water DIW to the processing unit after supplying the recovered solution supplied from the second discharge solution line to the processing unit.

Also, when a rinsing process is performed for the substrate after the substrate is processed by the first chemical solution, the processing solution supply unit mixes the recovered solution supplied from the first discharge solution line with deionized water DIW, and supplies the mixed solution to the processing unit. And, when a rinsing process is performed for the substrate after the substrate is processed by the second chemical solution, the processing solution supply unit mixes the recovered solution supplied from the second discharge solution line with deionized water DIW and supplies the mixed solution to the processing unit.

At least one of the first chemical solution and the second chemical solution may be an acidic solution and the other may be an alkalic solution.

The substrate processing system of the present disclosure includes a third discharge solution line connected to the downstream side of the discharge unit so that the discharged solution is selectively supplied from the discharge unit and delivered to the processing solution supply unit as the recovered solution. And, the third discharge solution line is supplied with the discharged solution having a higher resistivity as compared to the resistivity of the discharged solution supplied from the first and second discharge solution lines, the converting unit converts the flow of the discharged solution from the discharge unit into the third discharge solution line, and the processing solution supply unit supplies the recovered solution from the third discharge solution line to the processing unit.

Moreover, the processing solution supply unit includes a third valve that converts flow of the recovered solution supplied from the third discharge solution line to the processing unit.

The recovered solution may be discarded when a predetermined of time is elapsed after recovering the discharged solution from the first discharge solution line or the second discharge solution line.

A substrate processing method according to an embodiment of the present disclosure includes a first processing of a substrate by a first chemical solution and a first rinsing of the substrate in a processing unit, recovering a discharged solution from the processing unit as a first recovered solution while the first rinsing is being performed, a second processing of the substrate by a second chemical solution and a second rinsing of the substrate in the processing unit, recovering a discharged solution from the processing unit as a second recovered solution while the second rinsing is being performed, and selectively supplying each of the first and second recovered solutions to the processing unit.

The first processing includes mixing the first chemical solution with the first recovered solution, and supplying the mixed solution of the first chemical solution with the first recovered solution to the processing unit. And, the second processing includes mixing the second chemical solution with the second recovered solution, and supplying the mixed solution of the second chemical solution with the second recovered solution to the processing unit.

The first rinsing includes supplying the first recovered solution to the processing unit, and the second rinsing includes supplying the second recovered solution to the processing unit.

Specifically, the first rinsing includes supplying deionized water DIW to the processing unit, after supplying the first recovered solution to the processing unit, and the second rinsing includes supplying deionized water DIW to the processing unit, after supplying the second recovered solution to the processing unit.

Also, the first rinsing includes mixing deionized water DIW with the first recovered solution and supplying the mixed solution of deionized water DIW with the first recovered solution to the processing unit, and the second rinsing includes mixing deionized water DIW with the second recovered solution and supplying the mixed solution of deionized water DIW with the second recovered solution to the processing unit.

According to the substrate processing method of the present disclosure, the first recovered solution or the second recovered solution may be discarded when a predetermined of time is elapsed after recovering.

A computer-readable medium of the present disclosure stores a program that, when executed by a control computer, performs a substrate processing method. And, the substrate processing method includes a first processing of a substrate by a first chemical solution and a first rinsing of the substrate in a processing unit, recovering a discharged solution from the processing unit as a first recovered solution, while the first rinsing is being performed, a second processing of the substrate by a second chemical solution and a second rinsing of the substrate in the processing unit, recovering a discharged solution from the processing unit as a second recovered solution while the second rinsing is being performed, and selectively supplying each of the first and second recovered solutions to the processing unit.

According to the substrate processing apparatus, the substrate processing method and the computer-readable medium of the present disclosure, it may be possible to recover an extended amount of discharged solution from the processing unit, thereby reducing the amount of deionized water DIW necessary for the processing and the manufacturing cost.

Figure 2A:
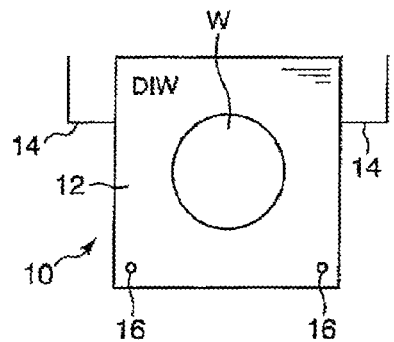
FIGS. 2 (a), (b), (c), (d), (e), (f) each illustrates sequential operations of a wafer process in the substrate processing apparatus as shown in FIG. 1.
Figure 3:
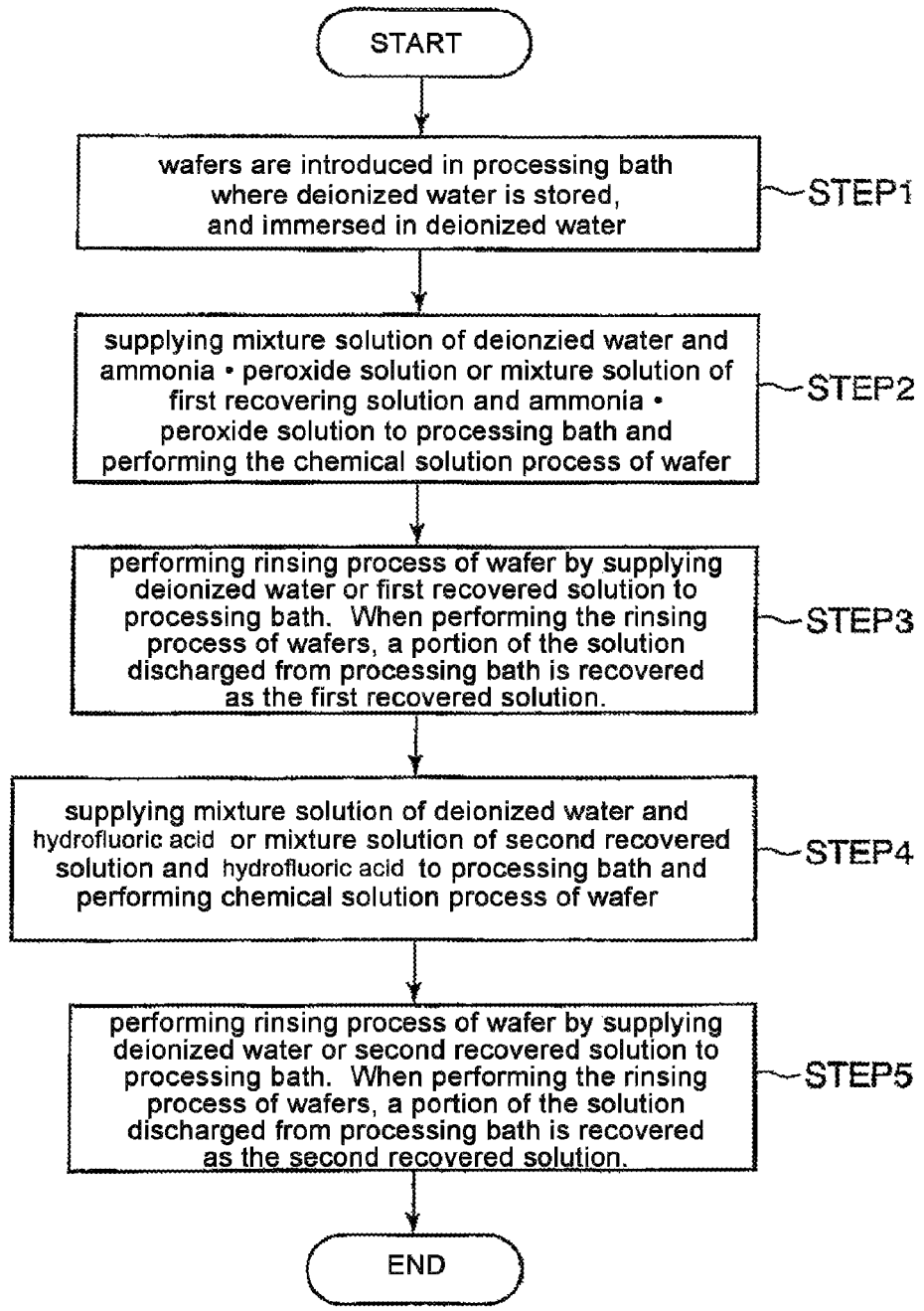
FIG. 3 is a flow chart illustrating a series of operations of the wafer process in the substrate processing apparatus as shown in FIG. 1.
Figure 4A:
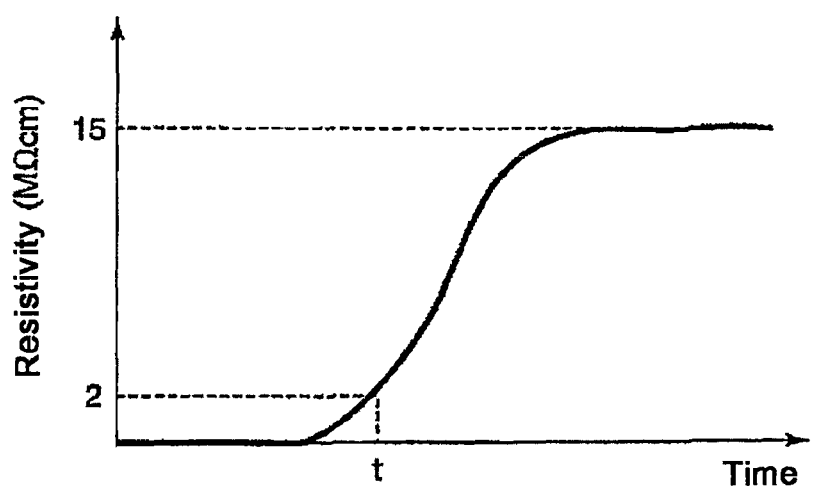
FIG. 4(a) is a graph illustrating the relationship between a time and a resistivity of a solution discharged from a processing unit after starting a rinsing process of the wafers.
Figure 4B:
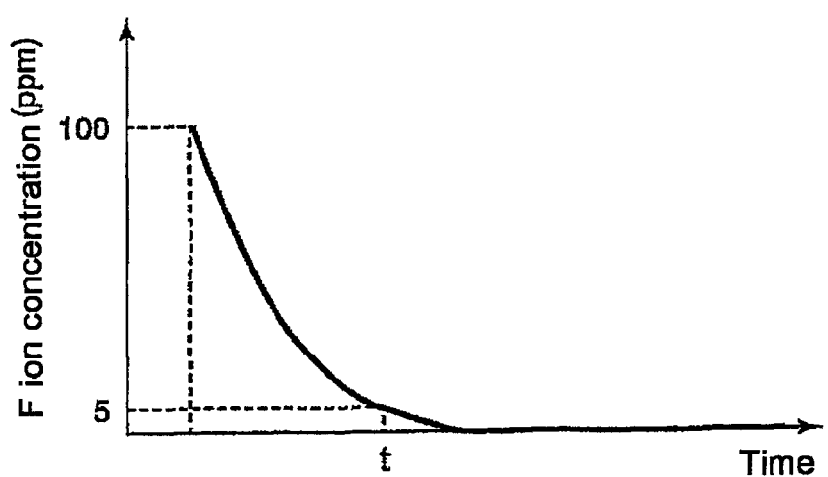
FIG. 4(b) is a graph illustrating the relationship between a time and an F ion concentration of the discharged solution after starting the rinsing process of the wafers.

Hereinafter, an exemplary embodiment will be described with reference to appended drawings. Each of FIGS. 1 through 4 illustrates the substrate processing apparatus and the substrate processing method according to an exemplary embodiment of the present disclosure. In particular, FIG. 1 is a schematic diagram of a substrate processing apparatus of the present disclosure. Also, FIGS. 2 (a) through (f) illustrate sequential operations of a wafer process in the substrate processing apparatus as shown in FIG. 1, and FIG. 3 is a flow chart illustrating a series of operations of the wafer process in the substrate processing apparatus as shown in FIG. 1. Also, FIG. 4 (a) is a graph illustrating the relationship between a time and a resistivity of a discharged solution discharged from a processing unit after starting a rinsing process of the wafer, and FIG. 4(b) is a graph illustrating the relationship between a time and an F ion concentration of the discharged solution after starting the rinsing process of the wafer.

Referring to FIG. 1, a substrate processing apparatus 1 of the present disclosure includes a processing unit 10 that performs a chemical solution process and a rinsing process of wafers W. Processing unit 10 includes a processing bath 12 that accommodates a plurality of wafers W (for example, 50 wafers) and performs the chemical solution process or the rinsing process for the accommodated wafers W. Processing unit 10 also includes an overflow bath 14 disposed near processing bath 12. An overflowed solution from processing bath 12 may be received at overflow bath 14. Also, a supply nozzle 16 for supplying processing solutions, such as the chemical solution or deionized water DIW into processing bath 12 is installed at a lower area of processing bath 12. A supply tube 20 is connected to supply nozzle 16 supplying the processing solution to supply nozzle 16. In processing unit 10, the processing solution such as the chemical solution or deionized water DIW is supplied from supply tube 20 to supply nozzle 16, and the processing solution is supplied from supply nozzle 16 to processing bath 12 and the processing solution is stored in processing bath 12. A plurality of wafers W are then immersed all at once into the processing solution stored in processing bath 12 thereby processing wafers W with the chemical solution or deionized water DIW.

Referring to FIG. 1, processing solution supply unit 30 is connected to supply tube 20. Processing solution supply unit 30 includes a deionized water source 22, and a valve 22a installed in the piping that connects deionized water source 22 with supply tube 20. A supply of deionized water DIW from deionized water source 22 to supply tube 20 may be adjusted by switching operation of valve 22a. Also, processing solution supply unit 30 includes a first recovering solution supply part 24 and a first valve 24a installed in the piping that connects first recovering solution supply part 24 with supply tube 20. A supply of the first recovered solution from first recovering solution supply part 24 to supply tube 20 may be adjusted by switching operation of valve 24a. First recovering solution supply part 24 may supply recovered solution from a first recovering part 42, recovered among the solution discharged from overflow bath 14 of processing unit 10, to processing unit 10. A description regarding first recovering part 42 will be followed.

Also, processing solution supply unit 30 includes a second recovering solution supply part 26 and a second valve 26a installed in the piping that connects second recovering solution supply part 26 with supply tube 20. A supply of the second recovered solution from second recovering solution supply part 26 to supply tube 20 may be adjusted by switching operation of valve 26a. Second recovering solution supply part 26 is configured to supply the solution from a second recovering part 44, recovered among the solution discharged from overflow bath 14 of processing unit 10, to processing unit 10. A description regarding second recovering part 44 will be followed. Also, processing solution supply unit 30 includes a third recovering solution supply part 28 and a third valve 28a installed in the piping that connects third recovering solution supply part 28 with supply tube 20. A supply of the third recovered solution from third recovering solution supply part 28 to supply tube 20 may be adjusted by switching operation of valve 28a. Third recovering solution supply part 28 may supply the solution from a third recovering part 46, recovered among the discharge solution discharged from overflow bath 14 of processing unit 10, to processing unit 10. A description regarding third recovering part 46 will be followed.

Referring to FIG. 1, an ammonia•peroxide solution (SC1, also called ammonia damping) supply source 32 is connected to supply tube 20 through a valve 32a, supplying alkalic ammonia•peroxide solution (SC1) to supply tube 20. Also, a hydrofluoric acid supply source 34 is connected to supply tube 20 through a valve 34a, supplying acidic hydrofluoric acid HF to supply tube 20. As illustrated in FIG. 1, ammonia•peroxide solution supply source 32 and hydrofluoric acid supply source 34 are installed in parallel.

A discharge unit 40 (a discharging tube) is connected to overflow bath 14 of processing unit 10, and the processing solution is discharged from overflow bath 14 to discharge unit 40. As illustrated in FIG. 1, an ohmmeter 50 is interposed in discharge unit 40 and detects the resistivity (conductivity) of the solution discharged from processing unit 10. In an embodiment, discharge unit 40 is divided into 4 lines as a first discharge solution line 42b, a second discharge solution line 44b, a third discharge solution line 46b and a drain line 48b at the downstream side of ohmmeter 50. Each of first discharge solution line 42b, second discharge solution line 44b, third discharge solution line 46b and drain line 48b is equipped with valves 42a, 44a, 46a, 48a, respectively. And, the flow of discharge solution from discharge unit 40 to first discharge solution line 42b, second discharge solution line 44b, third discharge solution line 46b and drain line 48b may be adjusted by switching each of corresponding valves 42a, 44a, 46a, 48a, respectively. That is, valves 42a, 44a, 46a, 48a form a converting unit 41 to adjust the flow of the discharge solution from discharge unit 40 to first discharge solution line 42b, second discharge solution line 44b, third discharge solution line 46b and drain line 48b.

Also, each of a first recovering unit 42, a second recovering unit 44, a third recovering unit 46 and a drain unit 48 is connected to the downstream side of first discharge solution line 42b, second discharge solution line 44b, third discharge solution line 46b and drain line 48b, respectively. An opening/closing of each of valves 42a, 44a, 46a, 48a of converting unit 41 is controlled by a control unit 70 (which will be described later) based on the resistivity of the discharged solution detected by ohmmeter 50, and the solution discharged from discharge solution tube 40 is selectively sent to one or more of first discharge solution line 42b, second discharge solution line 44b, third discharge solution line 46b and drain line 48b. Finally, the discharged solution is selectively sent to one or more of first recovering unit 42, second recovering unit 44, third recovering unit 46 and drain unit 48.

Generally, the higher the resistivity of the solution discharged from processing unit 10, the cleaner the discharged solution. That is, in a case where the resistivity of the solution discharged from processing unit 10 is relatively small, the discharged solution may not be clean enough to be recovered for a recycling. Referring to FIG. 4(a), the resistivity of the discharged solution is substantially zero until a predetermined of time is elapsed after starting the rinsing process of wafers W indicating that the discharged solution may not be clean. And, as the time for the rinsing process of wafers W increased, the resistivity of the discharged solution is increased gradually and then reaches a maximum value (specifically, for example 15MΩ·cm). Also, as illustrated in FIG. 4(b), as the time for the rinsing process of wafers W increased, the F ion concentration of the discharge solution decreases and the discharged solution is gradually becoming cleaner. And, the F ion concentration of the discharged solution reaches substantially zero after a predetermined of time is elapsed since the beginning of the rinsing process of wafers W.

As illustrated in FIGS. 4(a) and 4(b), at a time t where the resistivity of the discharged solution detected by ohmmeter 50 changes from zero to a predetermined value (for example 2MΩ·cm) after starting the rinsing process of wafers W, the F ion concentration of the discharged solution becomes sufficiently small. Thus, when the discharged solution is recovered while the resistivity of the discharged solution detected by ohmmeter 50 increases from zero, the recovered discharged solution may be sufficiently clean although the resistivity did not reach the maximum value (15 MΩ·cm). Specifically, as will be described later, since the recovered solution of the present disclosure does not need to be extremely clean, the discharged solution may be recovered when the resistivity of the solution is increased from zero to a certain amount, though the resistivity does not reach the maximum value (15 MΩcm).

First recovering part 42 recovers a portion of the solution discharged from processing unit 10 as a first recovered solution while the rinsing process of wafers W is performed after performing the chemical solution process of wafers W by ammonia•peroxide solution in the processing unit 10. The first recovered solution recovered by first recovering part 42 is sent to first recovering solution supply part 24 of processing solution supply unit 30 and then sent to supply tube 20.

Second recovering part 44 recovers a portion of the solution discharged from processing unit 10 as a second recovered solution while the rinsing process of wafers W is performed after performing the chemical solution process of wafers W by hydrofluoric acid HF in the processing unit 10. The second recovered solution recovered by second recovering part 44 is sent to second recovering solution supply part 26 of processing solution supply unit 30 and then sent to supply tube 20.

Third recovering part 46 recovers, as a third recovered solution, the discharged solution having a higher resistivity as compared to the resistivity of the first and second recovered solutions, among the solutions discharged from processing unit 10. The third recovered solution recovered by third recovering part 46 is sent to third recovering solution supply part 28 of processing solution supply unit 30 and then sent to supply tube 20.

The discharged solution having a relatively lower resistivity, that is, not a clean discharged solution, is sent to drain part 48, and discarded.

Also, substrate processing apparatus 1 is equipped with a control unit 70 having a computer that controls various components of substrate processing apparatus 1. Control unit 70 is connected to each component of substrate processing apparatus 1 and controls the chemical solution process and the rinsing process of wafers W in processing unit 10. Specifically, by controlling the switching operations of valves 22a, 24a, 26a, 28a of processing solution supply unit 30, control unit 70 controls the supply of deionized water DIW or the recovered solution each supplied from deionized water source 22 or each of recovering solution supply parts 24, 26, 28 to supply tube 20. Control unit 70 also controls the supply of chemical solutions from each of sources 32, 34 to supply tube 20 by controlling the opening and closing valves 32a, 34a. Moreover, control unit 70 adjusts a delivery assignment of the discharged solution among discharge solution lines 42b, 44b, 46b and drain line 48b by controlling the switching operation of each of valves 42a, 44a, 46a, 48a of converting unit 41. Also, the resistivity detection result of the discharged solution may be sent from ohmmeter 50 to control unit 70. A description regarding the control operation of each component of substrate processing apparatus 1 by control unit 70 will be followed.

In the present embodiments, control unit 70 is connected to a storage medium 72 that stores a control program to control the various processes performed in substrate processing apparatus 1 by controlling control unit 70, or a program (recipe) to have each of components of substrate processing apparatus 1 to execute various processes. Storage medium 72 may be a memory such as ROM or RAM. Storage medium 72 may also be a disk-type storage medium such as a hard disk, CD-ROM, DVD-ROM, and other types of well-known storage medium. Control unit 70 may call a recipe program from storage medium 72 and execute the recipe program for a desired process in substrate processing apparatus 1.

Hereinafter, a processing method of wafers W using substrate processing apparatus 1 will be described by referring to FIGS. 2 and 3. Also, a series of the chemical solution process and the rinsing process are performed by controlling each component of substrate processing apparatus 1 according to the program (recipe) stored in storage medium 72.

Initially, deionized water DIW is supplied from deionized water source 22 of processing solution supply unit 30 to processing bath 12 of processing unit 10, and the deionized water DIW is stored in processing bath 12. As illustrated in FIG. 2(a), wafers W are introduced in processing bath 12 where deionized water DIW is stored, and immersed in deionized water DIW (STEP 1 of FIG. 3).

Figure 2B:
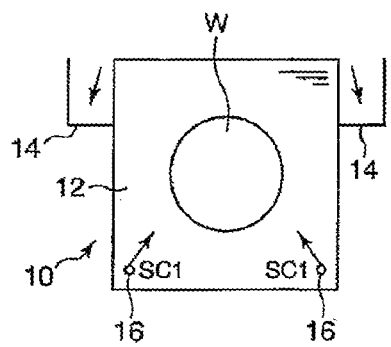

Subsequently, as illustrated in FIG. 2(b), deionized water DIW in processing bath 12 is replaced with ammonia•peroxide solution SC1 while wafers W are accommodated in processing bath 12. Specifically, while deionzied water is sent from deionized water source 22 of processing solution supply unit 30 to supply tube 20, and ammonia•peroxide solution is sent from ammonia•peroxide solution source 32 to supply tube 20 so that deionized water DIW is mixed with ammonia•peroxide solution in supply tube 20, and the mixed solution is sent to processing bath 12. At this time, the processing solution overflowed from processing bath 12 is sent to overflow bath 14, and discharged from overflow bath 14 to discharge tube 40. The solution discharged to discharge tube 40 is sent to drain unit 48 and is discarded eventually.

When deionized water DIW is replaced with ammonia•peroxide solution in processing bath 12, instead of sending deionized water DIW from deionized water source 22 to supply tube 20, the first recovered solution may be sent from first recovered solution supply part 24 of processing solution supply unit 30 to supply tube 20. In this case, the first recovered solution may be mixed with ammonia•peroxide solution in supply tube 20, and the mixed solution is sent to processing bath 12.

As described above, the chemical solution process of wafers W is performed with ammonia•peroxide solution SC1 by replacing deionized water DIW with ammonia•peroxide solution in processing bath 12 while wafers W are accommodated in processing bath 12 (STEP 2 in FIG. 3).

Figure 2C:
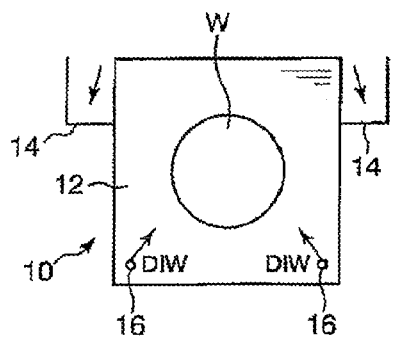

Next, as illustrated in FIG. 2(c), ammonia•peroxide solution SC1 is replaced with deionized water DIW while wafers W are accommodated in processing bath 12. Specifically, deionized water DIW is supplied from deionized water source 22 of processing solution supply unit 30 to processing bath 12 of processing unit 10. At this time, the processing solution overflowed from processing bath 12 is sent to overflow bath 14, and then discharged from overflow bath 14 to discharging tube 40. The resistivity for the solution discharged to discharge tube 40 is detected by ohmmeter 50. If the reisistivity of the discharged solution is higher than a predetermined value, it is determined that the discharged solution is clean. The discharged solution is then sent to first recovering unit 42 by controlling the switching operation of each of valves 42a, 44a, 46a, 48a of converting unit 41, and recovered at first recovering unit 42. The discharged solution recovered from first recovering unit 42 is sent to first recovering solution supply part 24 of processing solution supply unit 30 as a recovered solution to be reused. In the meantime, if the reisistivity of the discharged solution is lower than a predetermined value, it is determined that the discharged solution is not clean. The discharged solution is then sent to drain unit 48 and discarded eventually.

When ammonia•peroxide solution SC1 in processing bath 12 is replaced with deionized water DIW, the first recovered solution from first recovering solution supply part 24 may be sent to processing bath 12 of processing unit 10, instead of sending deionized water DIW from deionized water source 22 of processing solution supply unit 30 to supply tube 20. In this case, ammonia•peroxide solution SC1 in processing bath 12 is replaced with the first recovered solution.

Also, when ammonia•peroxide solution SC1 in processing bath 12 is replaced with deionized water DIW, the first recovered solution from first recovering solution supply part 24 of processing solution supply unit 30 may be sent to processing bath 12 first, and then deionized water DIW from deionized water source 22 may be sent to processing bath 12. At this time, only the first recovered solution may be sent from first recovering solution supply part 24 of processing solution supply unit 30 to processing bath 12 initially, and then the amount of the first recovered solution being sent to processing bath 12 may be decreased gradually and the amount of deionized water DIW sent from deionized water source 22 to processing bath may be increased gradually. As a result, only deionized water DIW is sent from deionized water source 22 to processing bath 12 eventually.

As described above, a rinsing process for wafers W are performed by replacing ammonia•peroxide solution SC1 with deionized water DIW or the recovered solution in processing bath 12 while wafers W are accommodated in processing bath 12. When performing the rinsing process of wafers W, a portion of the solution discharged from processing bath 12 is recovered as the first recovered solution (STEP 3 of FIG. 3). Here, the first recovered solution recovered by first recovering unit 42 may be mixed with ammonia•peroxide solution SC1 and sent to processing bath 12 at the chemical solution process of wafers W, or may be sent to processing bath 12 when the rinsing process is performed after the chemical solution process by ammonia•peroxide solution. Accordingly, the first recovered solution may not cause any trouble in the chemical solution processing of wafers W by ammonia•peroxide solution SC1 or in the rinsing process afterwards, even if the first recovered solution is not sufficiently clean. Namely, since the first recovered solution recovered by first recovering unit 42 is mainly used for the chemical solution process of wafers W using ammonia•peroxide solution, the first recovered solution may contain a certain degree of the ammonia•peroxide solution component.

Also, after recovering the first recovered solution by first recovering unit 42, the first recovered solution may be discarded after a predetermined of time is elapsed.

Figure 2D:
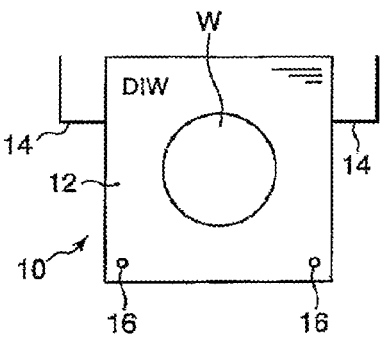
Figure 2E:
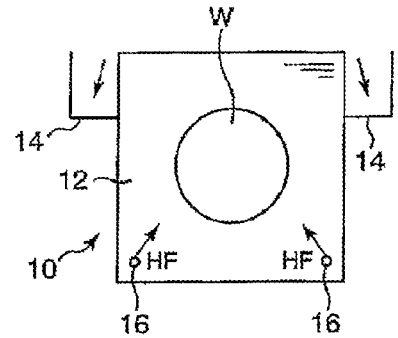

Next, referring to FIG. 2(d), wafers W are accommodated in processing bath 12 and deionized water DIW is stored in processing bath 12. As illustrated in FIG. 2(e), deionized water DIW in processing bath 12 is replaced with hydrofluoric acid HF while wafers W are immersed in deionized water DIW. Specifically, deionized water DIW is sent from deionized water source 22 of processing solution supply unit 30 to supply tube 20 and the hydrofluoric acid HF is sent from hydrofluoric acid source 34 to supply tube 20 so that deionized water DIW is mixed with the hydrofluoric acid HF in supply tube 20, and the mixed solution is sent to processing bath 12. At this time, the processing solution overflowed from processing bath 12 is sent to overflow bath 14, and the overflowed processing solution is discharged from overflow bath 14 to discharge solution tube 40. The discharged solution from discharge solution tube 40 is sent to drain unit 48 and is discarded eventually.

When deionized water DIW is replaced with hydrofluoric acid HF in processing bath 12, the second recovered solution may be sent from second recovering supply part 26 to supply tube 20, instead of sending deionized water DIW from deionized water source 22 of processing solution supply unit 30 to supply tube 20. In this case, the second recovered solution may be mixed with hydrofluoric acid HF in supply tube 20 and the mixed solution is sent to processing bath 12

As described above, the chemical solution process of wafers W is performed with hydrofluoric acid HF by replacing deionized water DIW with hydrofluoric acid HF in processing bath 12 while wafers W are accommodated in processing bath 12 (STEP 4 of FIG. 3).

Figure 2F:
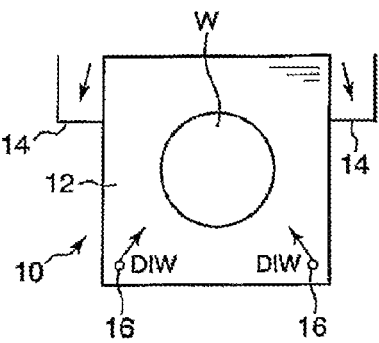

Next, referring to FIG. 2(f), hydrofluoric acid HF is replaced with deionized water DIW while wafers W are accommodated in processing bath 12. Specifically, deionized water DIW is supplied from deionized water source 22 of processing solution supply unit 30 to inside processing bath 12. At this time, the processing solution overflowed from processing bath 12 is sent to overflow bath 14, and the overflowed processing solution is discharged from overflow bath 14 to discharging tube 40. The resistivity of the solution discharged from discharge tube 40 is detected by ohmmeter 50. If the resistivity of the discharged solution is higher than a predetermined value, it is determined that the discharged solution is sufficiently clean, and, the discharged solution is sent to second recovering unit 44 for recovering by controlling each of valves 42a, 44a, 46a, 48a of converting unit 41. The discharged solution recovered from second recovering unit 44 is sent to second recovering solution supply part 26 of processing solution supply unit 30 to be reused as the recovered solution. On the other hand, if the resistivity of the discharged solution is lower than a predetermined value, it is determined that the discharged solution is not sufficiently clean. The discharge solution is then sent to drain unit 48 and discarded eventually.

When hydrofluoric acid HF is replaced with deionized water DIW in processing bath 12, the second recovered solution may be sent from second recovering solution supply part 26 to processing bath 12 of processing unit 10, instead of sending deionized water DIW from deionized water source 22 of processing solution supply unit 30 to supply unit 20. In this case, hydrofluoric acid HF is replaced with the second recovered solution in processing bath 12.

Also, when hydrofluoric acid HF is replaced with deionized water DIW in processing bath 12, the second recovered solution from second recovering solution supply part 26 of processing solution supply unit 30 may be sent to processing bath 12 first, and then deionized water DIW from deionized water source 22 may be sent to processing bath 12. At this time, only the second recovered solution may be sent from second recovering solution supply part 26 of processing solution supply unit 30 to processing bath 12 initially, and then the amount of the second recovered solution sent to processing bath 12 may be decreased gradually and the amount of deionized water DIW sent from deionized water source 22 to processing bath may be increased gradually so that only deionized water DIW may be sent from deionized water source 22 to processing bath 12.

As described above, the rinsing process of wafers W is performed by replacing hydrofluoric acid HF with deionized water DIW or the recovered solution in processing bath 12 while wafers W are accommodated in processing bath 12. Also, when performing the rinsing process of wafers W, a portion of the solution discharged from processing bath 12 is recovered as the second recovered solution (STEP 5 of FIG. 3). The second recovered solution recovered by second recovering unit 44 may be mixed with hydrofluoric acid HF and sent to processing bath 12 when the chemical solution process is performed for wafers W or may be sent to processing bath 12 when the rinsing process is performed for wafers W after the chemical solution process of wafers W by hydrofluoric acid HF. Accordingly, the second recovered solution may not cause any trouble in the chemical solution process of wafers W performed by using hydrofluoric acid HF or in the rinsing process afterwards, even if the second recovered solution is not sufficiently clean. Namely, since the second recovered solution recovered by first recovering unit 42 is mainly used for the chemical solution process of wafers W using the hydrofluoric acid HF, the second recovered solution may contain the hydrofluoric acid HF component to a certain degree.

Also, after recovering the second recovered solution by second recovering unit 44, the second recovered solution may be discarded after elapsing a predetermined of time.

Also, when performing the rinsing process of wafers W, the discharged solution having a higher resistivity than the resistivity of the first and second recovered solutions, among the solutions discharged from processing unit 10, may be recovered by a third recovering unit 46 as a third recovered solution. In this case, when performing the chemical solution process of wafers W performed by using ammonia•peroxide solution or hydrofluoric acid HF, or the rinsing process, the third recovered solution may be sent from third recovering supply part 28 to supply tube 20, instead of sending the first and the second recovered solutions from each of first and second recovering solution supply parts 24 and 26 to supply tube 20.

As described above, according to substrate processing apparatus 1 and substrate processing method of the present embodiment, first discharge solution line 42b and second discharge solution line 44b are branched off and contacted at the downstream side of discharge solution tube 40, and the discharged solution from discharge solution tube 40 is selectively sent to first discharge solution line 42b or second discharge solution line 44b. And the discharged solution from each of first discharge solution line 42b and second discharge solution line 44b is independently sent to processing solution supply unit 30 as the recovered solution. Converting unit 41 is installed at a junction point from discharge unit to first and second discharge solution lines 42b and 44b converting the flow of the discharged solution from discharge solution tube 40 to first and second discharge solution lines 42b and 44b. And, processing solution supply unit 30 selectively supplies the recovered solution sent from first discharge solution line 42b and second discharge solution line 44b to processing unit 10.

As described above, the discharged solutions from processing bath 12 of processing unit 10 discharged after the rinsing process of wafers W is separately recovered and reused according to the type of the chemical solution used in the chemical process for wafers W. As a result, the first recovered solution may be used either in the chemical solution process of wafers W processed by using ammonia•peroxide solution related to the first recovered solution or in the rinsing process of wafers W performed after the chemical solution process. Also, the second recovered solution may be used in the chemical solution process of wafers W processed by using hydrofluoric acid HF related to the second recovered solution or the rinsing process of wafers W performed after the chemical solution process. Therefore, the first recovered solution may not cause any trouble in the chemical solution process processed by using ammonia•peroxide solution or in the rinsing process of wafers W even if the first recovered solution is not sufficiently clean. In the same manner, the second recovered solution may not cause any trouble in the chemical solution process processed by using hydrofluoric acid HF or the rinsing process of wafers W even if the second recovered solution is not sufficiently clean. In other word, the recovered solution may contain a certain degree of chemical solution component since each of the first and second recovered solutions is mainly used for the chemical solution process related to the specific chemical solution or for the rinsing process of wafers W. Thus, a relatively more amount of the discharged solution may be recovered from processing unit 10 and reused, because the discharged solution can be recovered from processing bath 12 of processing unit 10 even if the processing time is not elapsed too long since the beginning of the rinsing process of wafers W. Therefore, the necessary amount of deionized water DIW may be decreased and overall manufacturing cost such as the driving cost may be decreased as well.

In substrate processing apparatus 1 and substrate processing method of the present embodiment, processing solution supply unit 30 may supply the first recovered solution sent from first discharge solution line 42b to processing unit 10 when processing unit 10 performs the chemical solution process of wafers W using ammonia•peroxide solution. Also, processing solution supply unit 30 may supply the second recovered solution sent from second discharge solution line 44b to processing unit 10 when processing unit 10 performs the chemical solution of wafers W using hydrofluoric acid HF.

Also, in substrate processing apparatus 1 and substrate processing method of the present embodiment, converting unit 41 may convert the flow of the discharged solution from discharge solution tube 40 to first discharge solution line 42b, and processing solution supply unit 30 may supply the recovered solution sent from first discharge solution line 42b to processing unit 10 when processing unit 10 performs the rinsing process of wafers W after performing the chemical solution process using ammonia•peroxide solution. At this time, the recovered solution may be sent first from first recovering solution supply part 24 of processing solution supply unit 30 to processing unit 10, and then deionized water DIW may be sent from deionized water source 22 to processing unit 10. Also, converting unit 41 may convert the flow of the discharged solution from discharge solution tube 40 to second discharge solution line 44b, and processing solution supply unit 30 may supply the recovered solution sent from second discharge solution line 44b to processing unit 10 when processing unit 10 performs the rinsing process of wafers W after performing the chemical solution process using hydrofluoric acid HF. At this time, the recovered solution may be sent first from second recovering solution supply part 26 of processing solution supply unit 30 to processing unit 10, and then deionized water DIW may be sent from deionized water source 22 to processing unit 10.

Also, when processing unit 10 performs rinsing process of wafers W after performing the chemical solution process using ammonia•peroxide solution, deionized water DIW supplied from deionized water source 22 may be mixed with the recovered solution supplied from first recovering solution supply part 24 and the mixed solution may be sent to processing unit 10. Also, when processing unit 10 performs rinsing process of wafers W after performing the chemical solution process using hydrofluoric acid HF, deionized water DIW supplied from deionized water source 22 may be mixed with the recovered solution supplied from second recovering solution supply part 26, and the mixed solution may be sent to processing unit 10.

As described above, among a plurality of chemical solutions sent to processing unit 10 (two chemical solutions in the present embodiment), one of the chemical solutions is an acidic solution (hydrofluoric acid HF) and the other is an alkalic solution (ammonia•peroxide solution).

Also, in substrate processing apparatus 1 and substrate processing method of the present embodiment, when a predetermined time is elapsed after recovering the discharged solution from first recovering unit 42 or second recovering unit 44, the recovered discharged solution may be discarded, thereby preventing reusing of the recovered solution having a degraded quality.

Substrate processing apparatus 1 and substrate processing method of the present disclosure may not be limited to embodiments described above, but may have various alternative embodiments. For example, processing unit 10 that processes wafers W may not be limited to a batch-type unit where the chemical solution or deionized water DIW are stored in processing bath 12 and a plurality of wafers W (for example, 50 wafers) are immersed in the stored processing solution all at the same time, as shown in FIG. 1. Processing unit may be a single-wafer type where a plurality of wafers W are processed one by one. In the single-wafer type processing unit, a piece of wafer W may be disposed on a wafer chuck in a horizontal direction, and rotated on the wafer chuck while the chemical solution or deionized water DIW is supplied to the surface of the wafer W to perform the chemical solution process or the rinsing process of the wafer W.

Moreover, instead of installing ohmmeter 50 at discharge solution tube 40, an ion densitometer or a TOC (Total Organic Carbon) indicator may be installed at discharge solution tube 40 thereby detecting the ion density of the solution discharged from overflow bath 14 to discharge solution tube 40. In the case where the ion densitometer is installed at discharge solution tube 40 and ion concentration of the solution discharged from overflow bath 14 of processing unit 10 to discharge solution tube 40 is detected to be lower than a predetermined value, the discharged solution may be recovered to first and second recovering units 42 and 44 when performing the rinsing process of wafers W. The discharged solution having a higher ion concentration than the predetermined value is sent to drain unit 48 and discarded. Also, in the case where the TOC indicator is installed at discharge solution tube 40 and ion concentration of the solution discharged from overflow bath 14 of processing unit 10 to discharge solution tube 40 is detected to be lower than a predetermined value, the discharged solution may be recovered to first and second recovering unit 42 and 44 when performing the rinsing process of wafers W. The discharged solution having a higher TOC than the predetermined value is sent to drain unit 48 and is discarded.

Also, instead of installing ohmmeter 50 at discharge solution tube 40, the discharged solution from processing unit 10 may be recovered based on an elapsing time after starting the rinsing process of wafers W. In this case, the discharged solution from overflow bath 14 of processing unit 10 to discharge solution tube 40 may be sent to drain unit 48 for discarding until the elapsing time reaches the predetermined time after starting the rinsing process of wafers W. And, the discharged solution from overflow bath 14 of processing unit 10 to discharge solution tube 40 may be recovered to first or second recovering units 42 or 44 after a predetermined time is elapsed since the beginning of the rinsing process.

Also, in substrate processing apparatus 1 and substrate processing method described above, the chemical solution process is performed by using two types of chemical solutions, but more than three types of chemical solutions may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a processing unit that processes a substrate;
a processing solution supply unit that supplies a processing solution to the processing unit;
a first chemical solution supply unit that supplies a first chemical solution to the processing unit;
a second chemical solution supply unit that supplies a second chemical solution to the processing unit;
a discharge unit including an ohmmeter and configured to discharge a solution from the processing unit;
a first discharge solution line and a second discharge solution line each connected to a downstream side of the discharge unit;
a converting unit disposed at a junction between the discharge unit and the two discharge solution lines, and
a control unit that controls an overall operation of the substrate processing apparatus including the processing unit, the processing solution supply unit, the first chemical solution supply unit, the second chemical solution supply unit, the discharge unit, the first discharge solution line, and the converting unit,
wherein the control unit is programmed to control the substrate processing apparatus such that the converting unit selectively flows only a portion of discharged solution to the first discharge solution line as a first recovered solution when it is detected by the ohmmeter that the discharged solution has a resistivity higher than approximately 13% of a maximum resistivity while the substrate is being rinsed in the processing unit after being processed with the first chemical solution, or flows only a portion of discharged solution to the second discharge solution line as a second recovered solution when it is detected by the ohmmeter that the discharged solution has a resistivity higher than approximately 13% of a maximum resistivity while the substrate is being rinsed in the processing unit after being processed with the second chemical solution,
wherein the processing solution supply unit is equipped with a deionized water supply unit that supplies deionized water to the processing unit as a processing liquid, a first recovered solution supply unit that supplies the first recovered solution to the processing unit, and a second recovered solution supply unit that supplies the second recovered solution to the processing unit, and
wherein the control unit is programmed to control the processing solution supply unit such that at least one of the deionized water and the first recovered solution is supplied to the processing unit when the substrate is either being processed in the processing unit with the first chemical solution or being rinsed in the processing unit after the processing with the first chemical solution, and at least one of the deionized water and the second recovered solution is supplied to the processing unit when the substrate is either being processed in the processing unit with the second chemical solution or being rinsed in the processing unit after the processing with the second chemical solution.

2. The substrate processing apparatus of claim 1, wherein the processing solution supply unit further comprises, a first valve that converts flow of the first recovered solution to the processing unit, and
a second valve that converts flow of the second recovered solution to the processing unit.

3. The substrate processing apparatus of claim 1, wherein the processing solution supply unit supplies the first recovered solution to the processing unit when the substrate is processed with the first chemical solution, and
the processing solution supply unit supplies the second recovered solution to the processing unit when the substrate is processed with the second chemical solution.

4. The substrate processing apparatus of claim 1, wherein, when a rinsing process is performed for the substrate after the substrate is processed by the first chemical solution, the converting unit converts flow of the discharged solution so that the discharge solution flows from the discharge unit to the first discharge solution line, and the processing solution supply unit supplies the first recovered solution to the processing unit, and
wherein, when a rinsing process is performed for the substrate after the substrate is processed by the second chemical solution, the converting unit converts flow of the discharged solution so that the discharged solution flows from the discharge unit to the second discharge solution line, and the processing solution supply unit supplies the second recovered solution to the processing unit.

5. The substrate processing apparatus of claim 4, wherein the processing solution supply unit supplies deionized water in addition to supplying the first recovered solution and the second recovered solution to the processing unit.

6. The substrate processing apparatus of claim 5, wherein the processing solution supply unit includes a converting valve configured to convert supply of deionized water to the processing unit.

7. The substrate processing apparatus of claim 5, wherein, when a rinsing process is performed for the substrate after the substrate is processed by the first chemical solution, the processing solution supply unit supplies deionized water to the processing unit after supplying the first recovered solution to the processing unit, and
wherein, when a rinsing process is performed for the substrate after the substrate is processed by the second chemical solution, the processing solution supply unit supplies deionized water to the processing unit after supplying the second recovered solution to the processing unit.

8. The substrate processing apparatus of claim 5, wherein, when a rinsing process is performed for the substrate after the substrate is processed by the first chemical solution, the processing solution supply unit mixes the first recovered solution with deionized water, and supplies the mixed solution to the processing unit, and wherein, when a rinsing process is performed for the substrate after the substrate is processed by the second chemical solution, the processing solution supply unit mixes the second recovered solution with deionized water and supplies the mixed solution to the processing unit.

9. The substrate processing apparatus of claim 1, wherein at least one of the first chemical solution and the second chemical solution is an acidic solution and the other is an alkalic solution.

10. The substrate processing apparatus of claim 1 further comprising a third discharge solution line connected to the downstream side of the discharge unit so that the discharged solution is selectively supplied from the discharge unit and delivered to the processing solution supply unit as a third recovered solution, wherein the third discharge solution line is supplied with the discharged solution having a higher resistivity as compared to the resistivity of the discharged solution supplied from the first and second discharge solution lines, the converting unit converts flow of the discharged solution from the discharge unit into the third discharge solution line, and the processing solution supply unit supplies the third recovered solution to the processing unit.

11. The substrate processing apparatus of claim 10, wherein the processing solution supply unit further comprises a third valve that converts flow of the third recovered solution to the processing unit.

12. The substrate processing apparatus of claim 1, wherein the first recovered solution or the second recovered solution is discarded when a predetermined of time is elapsed after recovering the discharged solution from the first discharge solution line or the second discharge solution line.

* * * * *